(12) United States Patent
Hamano et al.

(10) Patent No.: US 6,347,035 B1
(45) Date of Patent: Feb. 12, 2002

(54) LOW PROFILE EMI SHIELD WITH HEAT SPREADING PLATE

(75) Inventors: Takeshi Hamano, Zama (JP); Kevin Seichi Yamada, Sunnyvale, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/183,039

(22) Filed: Oct. 30, 1998

(51) Int. Cl.[7] .................................................. G06F 1/16
(52) U.S. Cl. ........................ 361/687; 361/424; 361/690; 361/700; 361/818; 174/35 R
(58) Field of Search ................................ 361/687, 690, 361/818, 700, 424; 174/35 R

(56) References Cited

U.S. PATENT DOCUMENTS

| 5,030,793 A | 7/1991 | McCarthy |
| 5,124,198 A | 6/1992 | Koskenmaki et al. |
| 5,175,613 A | 12/1992 | Barker, III et al. |
| 5,318,855 A | 6/1994 | Glovatsky et al. |
| 5,355,278 A | 10/1994 | Hosoi et al. |
| 5,399,295 A | 3/1995 | Gamble et al. |
| 5,436,803 A | 7/1995 | Annis et al. |
| 5,568,360 A | 10/1996 | Penniman et al. |
| 5,597,979 A | 1/1997 | Courtney et al. |
| 5,712,762 A | 1/1998 | Webb |
| 5,740,013 A | 4/1998 | Roesner et al. |
| 5,847,925 A | * 12/1998 | Progl et al. ................. 361/687 |
| 5,880,930 A | * 3/1999 | Wheaton .................... 361/690 |
| 6,122,167 A | * 9/2000 | Smith et al. ................. 361/687 |

* cited by examiner

*Primary Examiner*—Leo P. Picard
*Assistant Examiner*—Yean-Hsi Chang
(74) *Attorney, Agent, or Firm*—Coudert Brothers

(57) ABSTRACT

A combined electromagnetic interference (EMI) shield and heat dissipation is comprised of a five-sided receptacle coupled to a heat spreading plate. The receptacle is composed of a shield material having an insulated interior coating. A compact, low profile assembly to house the motherboard of notebook computer achieves a significant reduction in vertical thickness by combining the functions of an EMI shield and heat dissipation structure.

7 Claims, 5 Drawing Sheets

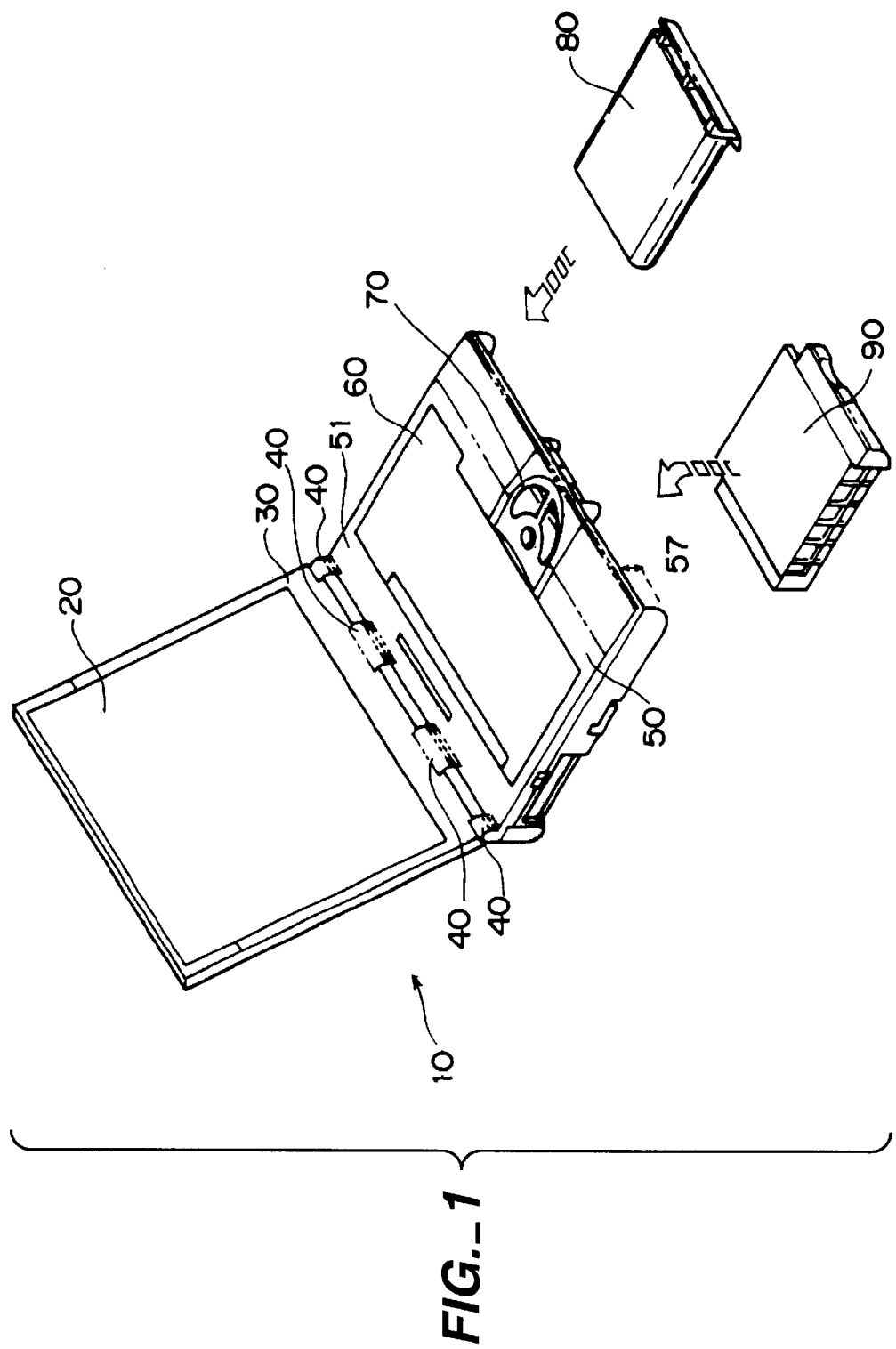
FIG._1

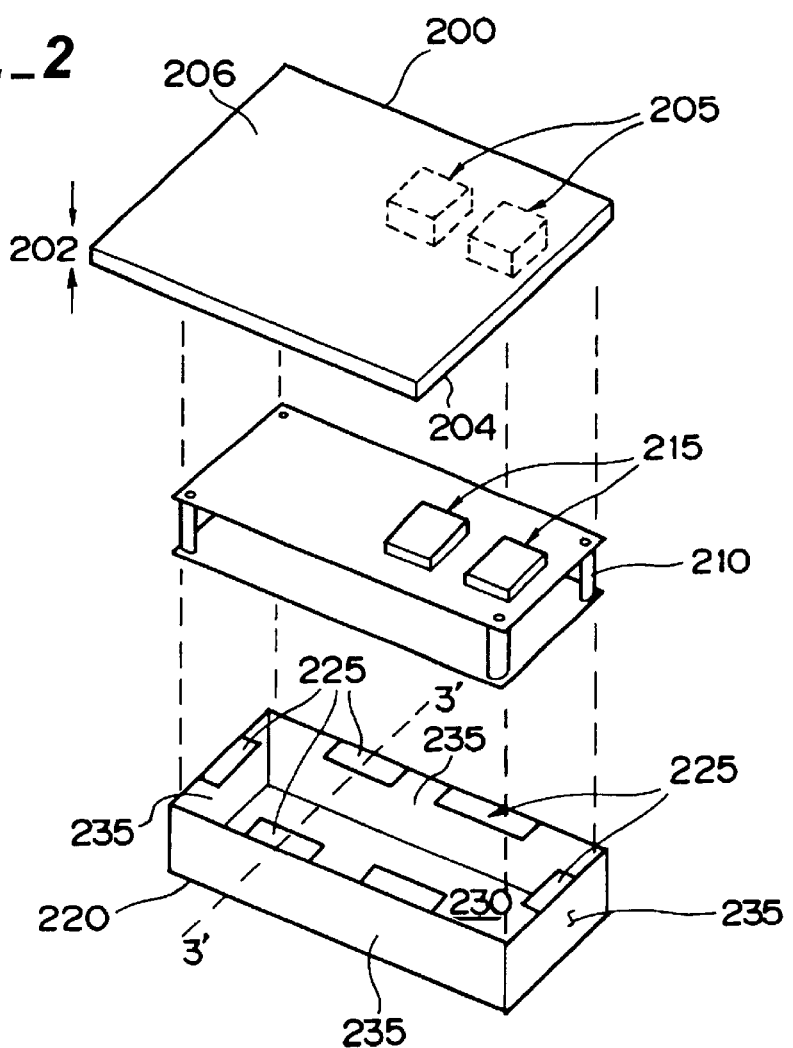
FIG._2
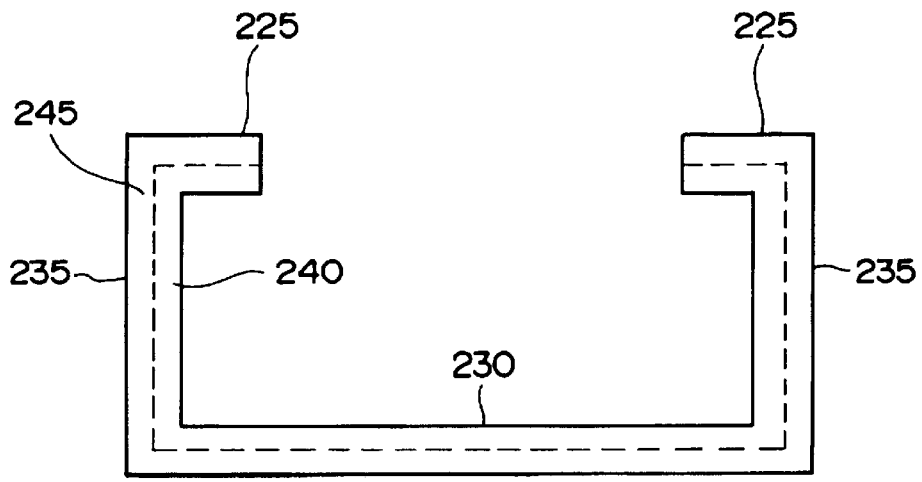
FIG._3

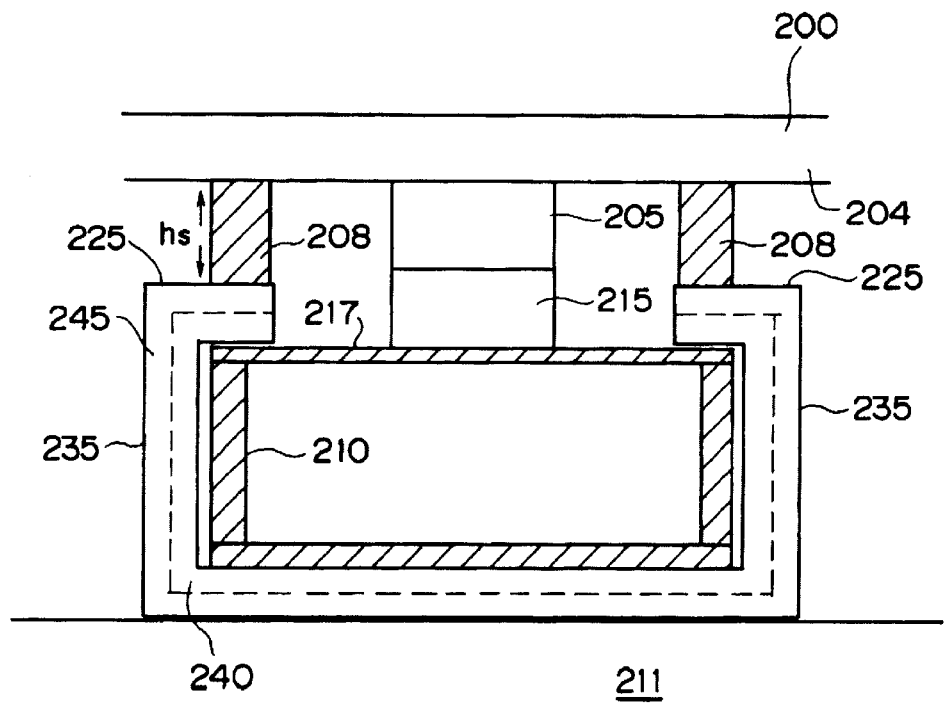
FIG._4a
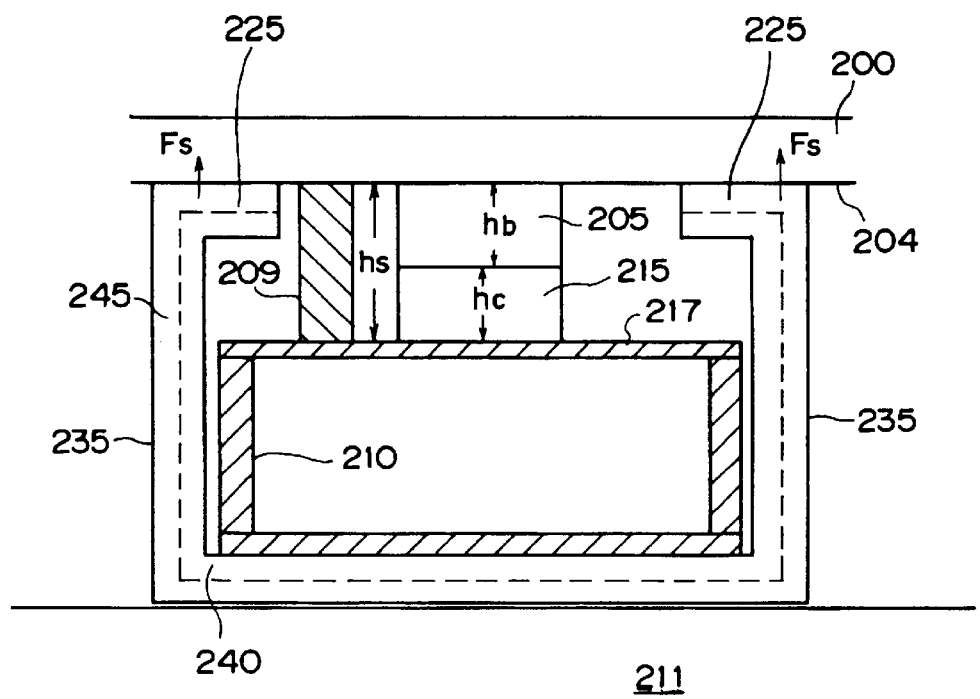
FIG._4b

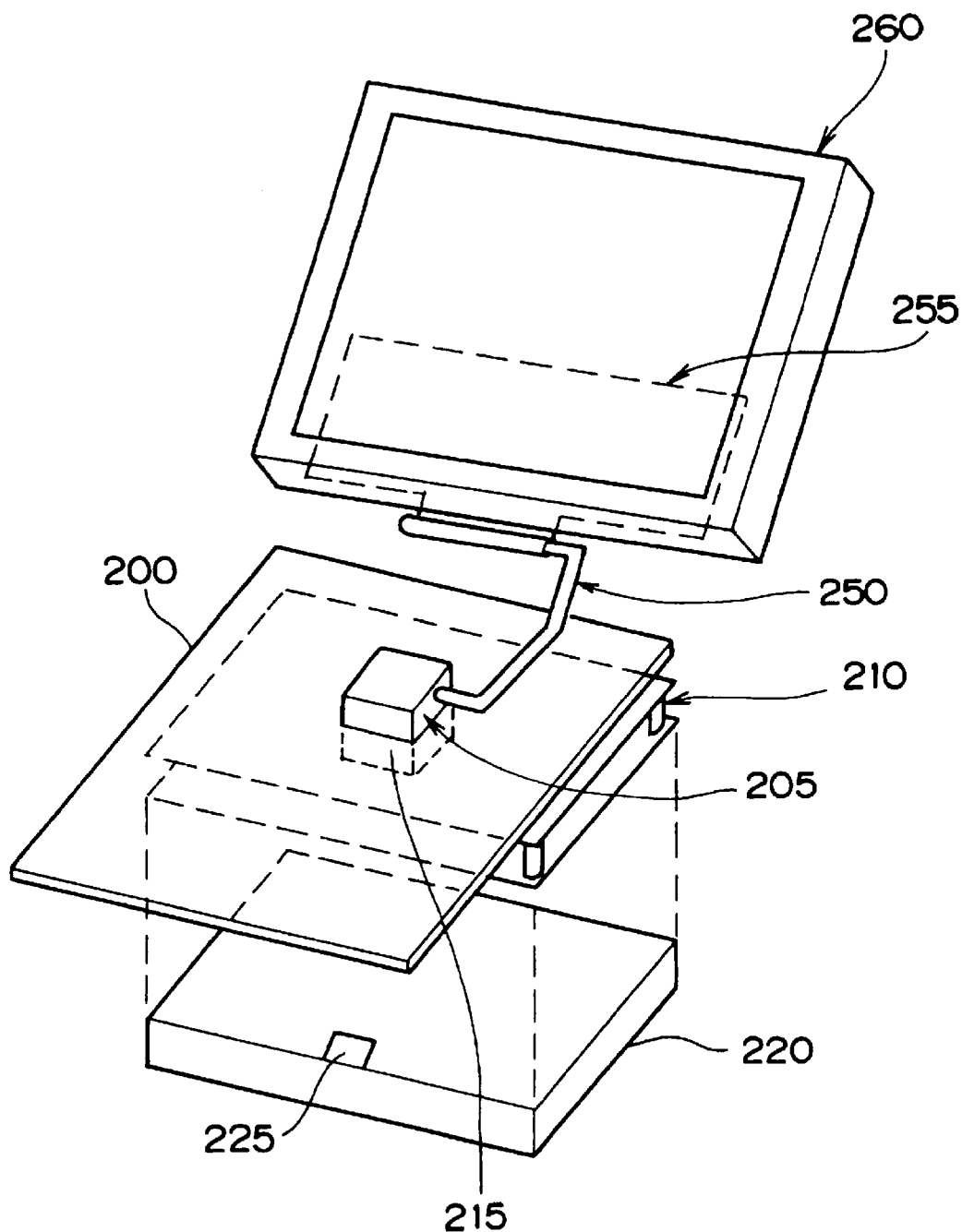
FIG._5

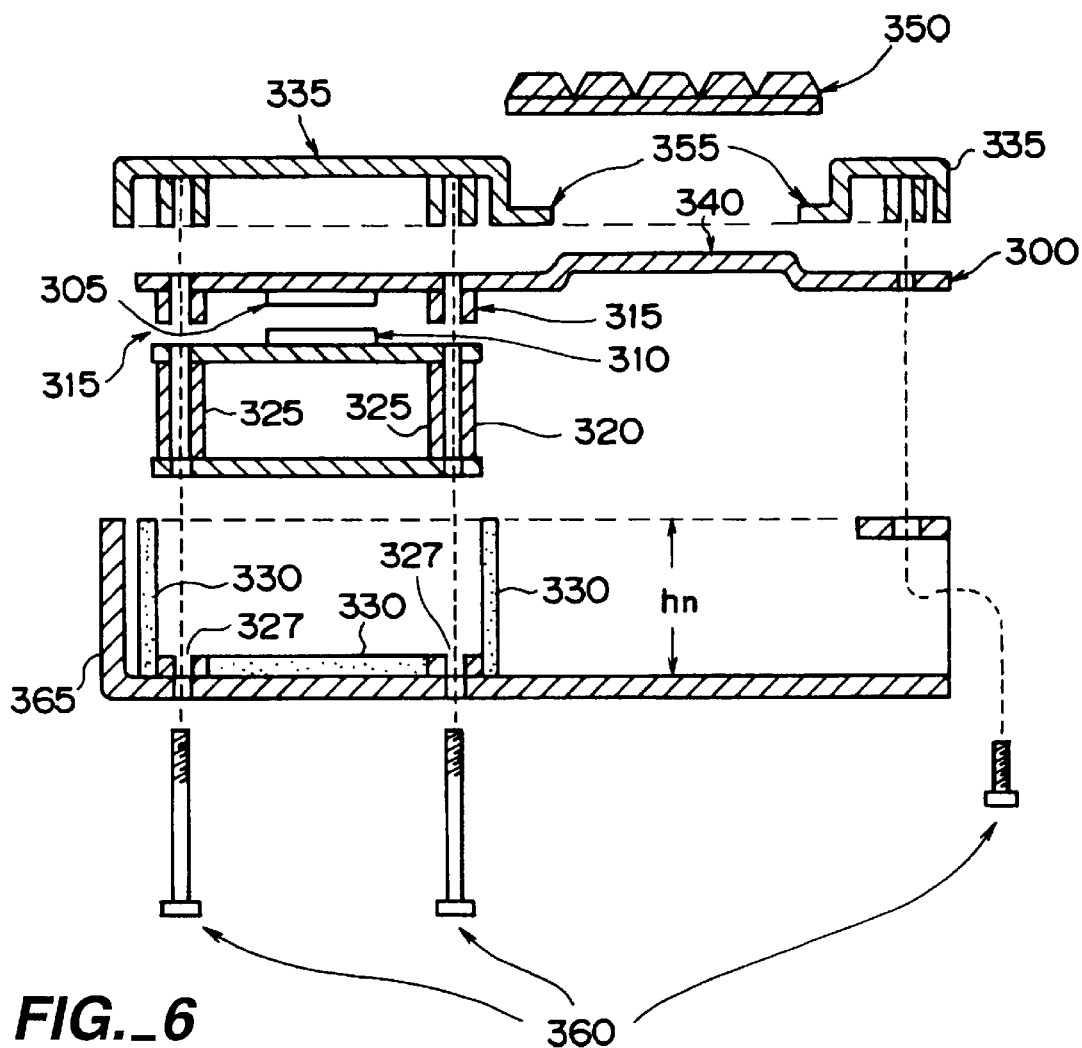
FIG._6

LOW PROFILE EMI SHIELD WITH HEAT SPREADING PLATE

FIELD OF THE INVENTION

This invention relates generally to Electromagnetic Interference (EMI) shielding structures. More specifically, this invention relates to a compact EMI shield structure that also incorporates a heat sink.

BACKGROUND OF THE INVENTION

Compact, portable computers are becoming increasingly popular among college students, businesspeople, writers, and others who require portable word-processing, e-mail, and computer graphics capabilities. In particular, notebook-sized computers, commonly known as "notebook computers," are becoming increasingly popular because their small size and low weight make them portable and convenient to use.

Generally, a notebook computer comprises two main sections coupled together by hinges in a clamshell configuration. The first section contains a liquid crystal display (LCD) for displaying information. The LCD screen is disposed in a LCD bezel frame. Typically, the bezel frame is less than about one centimeter in thickness. The second section of the notebook computer comprises a compact computer base section with a keypad area for entering data. The computer base of a notebook computer has a low profile in that its vertical thickness is as thin as possible to minimize the bulk of the notebook computer in its folded configuration. Typically the computer base section of a notebook computer is less than about four centimeters in height and is preferably about two centimeters in height. Typically the computer base section has a width and length comparable to a notebook pad (e.g., preferably less than about 8½ inches by 11 inches). Generally it is desirable to reduce the width and the length of the computer base section as much as possible consistent with a keyboard design that is comfortable for the user to input data with for extended periods of time. Commonly, conventional QWERTY keyboards are used in notebook computers, with the QWERTY keyboard substantially filling the upper surface of the computer base section. However, alternate computer keyboard designs that achieve the function of a QWERTY keyboard in a more space efficient configuration are known to those of ordinary skill in the art.

Notebook computer designers face the challenge of increasing the functionality of a notebook computer while maintaining a low-profile housing. Typically, the centermost portion of the computer base is densely packed with electronic circuits that must fit into a volume that has a vertical height of between two-to-three centimeters. For example, the main motherboard is preferably a double-sided motherboard with electronic chips on both sides of a printed circuit board. In addition to the motherboard, the centermost portion of the computer base also contains support and mounting elements, electrical interconnection elements, and electrical isolation elements. Moreover, the frame of the computer base and the keyboard assembly also consumes part of the vertical height of the computer base.

The central processing unit (CPU) of a high performance notebook computer operates at a high clock rate. Heat is generated at every switching event. Consequently, a high clock rate causes the CPU to generate heat at a rapid rate. This heat must be dissipated to maintain the CPU at an acceptable operating temperature. One solution to dissipating the heat from high performance chips that are used in a conventional desk-top computer is to couple a high performance heat sink to the CPU. However, high performance heat sinks typically have a substantial thickness associated with the finned heat sink and the fan used to blow air over the fins of the heat sink. As an illustrative example, a compact heat sink and fan that is about one centimeter in height would consume a substantial fraction (e.g., about one-third) of the height of the computer base section of a notebook computer that is three centimeters in height. Although some miniaturization of a conventional heat sink and fan is possible, conventional extruded (finned) heat sinks are typically between about five-to-ten millimeters in height while conventional fans are typically a substantial fraction of a centimeter in height. Consequently, use of conventional heat dissipation structures which include a finned heat sink and fan may be inconsistent with a low profile notebook computer base that has sufficient vertical height for a double-sided motherboard and other mounting, support, and electronic interconnection elements.

Electromagnetic interference (EMI) is also a problem in high performance notebook computers. The high clock rate of the CPU of a high performance notebook computer is associated with high-frequency signal components. These high-frequency signal components may generate electromagnetic waves which propagate to other portions of the notebook computer or to neighboring electronic circuits and produce deleterious electromagnetic interference (EMI). An additional EMI shield comprising a conductive enclosure substantially surrounding the CPU is required to reduce the EMI to acceptable levels. According to well-known principles of electromagnetic theory, a conductive enclosure shields, or blocks, the propagation of electromagnetic radiation from an enclosed source. An EMI shield enclosure is commonly shaped as a six-sided box, although it may have other shapes that substantially enclose the EMI source. Some conventional notebook computers utilize five pieces of sheet metal in the computer base section with an additional separate metal cover to form a six-sided EMI shield substantially surrounding the motherboard. However, using sheet metal to form a six-sided EMI shield significantly increases the size and weight of a notebook computer. Alternatively, a substantially six-sided EMI shield enclosure may be formed in a notebook computer by coating the inner walls of the computer base housing with a conductive coating. However, since electronic components must be tightly spaced within a notebook computer, proactive measures must be taken to prevent shorting of electronic circuits to the EMI shield, such as adding additional insulating spacer elements to electronically isolate electronic circuit elements from the conductive walls of the EMI shield. Application of a conductive coating may also have fabrication disadvantages, such as problems associated with applying a high-quality conformal coating that properly adheres to housing surfaces.

One technique to reduce the weight of an EMI shield is to form a bag-like enclosure out of a flexible conductive film instead of sheet metal. Unfortunately, a flexible EMI bag-like enclosure comprised of insulating and conducting layers is largely inconsistent with the use of conventional heat sinks. For example, U.S. Pat. No. 5,436,803 teaches the use of a flexible electrically insulating bag with additional metal fibers embedded in the insulated material of the bag. Similarly, U.S. Pat. No. 5,597,979 teaches the use of a bag-like EMI shield comprising a conductive material either embedded in or laminated on one side of an insulating sheet. A flexible bag-like enclosure with an insulated interior surface provides the advantage that the bag-like enclosure may be slipped around an assembled printed circuit board. A neck or partially open end of a flexible bag-like enclosure may also facilitate making/changing electrical connections to the printed circuit board enclosed by the bag. However, bag-like enclosures are inconsistent with the use of conventional heat sinks. This is primarily because a bag-like EMI enclosure placed around a circuit board would block the flow of air across an interior heat sink. Thus, a bag-like EMI enclosure surrounding an internal circuit board assembly and heat sink is inconsistent with effective cooling of the electronics assembly by heat exchange to the atmosphere.

In addition, a conventional heat sink cannot be effectively thermally coupled to an electronics assembly contained within a flexible EMI enclosure. It is well known in the art of materials science that an electrically insulating layer tends to be a good thermal insulator. Consequently, a bag-enclosure comprised of an outer electrically conductive layer attached to (or embedded in) an electrically insulating layer will tend to create a large thermal resistance between an enclosed electronics assembly and an exterior heat sink. An additional problem with EMI shields comprising bag-like enclosures is that conventional polymers and plastics used to fabricate a flexible electrically insulating film tend to deform and/or melt at common solder bonding process temperatures. Thus, it would be difficult to use a solder process to achieve an effective thermal or electrical coupling between the EMI-shield enclosures of U.S. Pat. Nos. 5,436,803 and 5,597,979 and conventional heat sinks.

The combined size and weight of an EMI shield and heat sink is significant in the context of a notebook computer. Unfortunately, conventional EMI shields cannot be directly combined with conventional heat sinks to achieve a substantial reduction in the vertical height and/or weight of a notebook computer. The electronics package of U.S. Pat. No. 5,175,613 utilizes the conductive surface of a finned heat sink to form an upper surface of an EMI shield surrounding a chip disposed on a single (top) surface of a printed circuit board. The finned heat sink of U.S. Pat. No. 5,175,613 is mechanically secured to the printed circuit board by a bolt or screw. The bolt or screw also electrically couples the heat sink to a ground reference plane disposed in the center of the printed circuit board. The package of U.S. Pat. No. 5,175,613 provides EMI and thermal protection to circuit chips disposed between the conductive surfaces of the heat sink and the ground reference plane of the printed circuit board. However, the package of U.S. Pat. No. 5,175,613 is not designed to address the space and weight constraints of a high performance notebook computer.

One problem with the package of U.S. Pat. No. 5,175,613 is that the use of a finned heat sink typically consumes a significant vertical height and often requires an additional fan element to achieve satisfactory heat dissipation results. For example, finned (extruded) heat sinks suitable for cooling a motherboard assembly typically have a height of five-to-ten millimeters, which is a significant fraction of the available vertical height in the computer base of a notebook computer. Also, conventional finned heat sinks commonly comprise a significant amount of a high conductivity metal, such as copper. Thus, while the combined heat sink/EMI shield eliminates the need for additional EMI shielding components, the total height and weight of the package may still be undesirably large for notebook computer applications.

Another problem with the package of U.S. Pat. No. 5,175,613 is that it is inconsistent with a double-sided motherboard that has chips mounted to both the top and bottom sides of the printed circuit board. U.S. Pat. No. 5,175,613 explicitly teaches that the electronic chips are disposed on only one side of a printed circuit board. This permits the underlying ground reference plane of the printed circuit board to be used to form one surface of an EMI shield surrounding the chips. In order to modify the teachings of U.S. Pat. No. 5,175,613 for a double-sided motherboard, a second heat sink (or other five-sided EMI enclosure comprised of sheet metal) would have to be added around the bottom side of the motherboard to form an EMI shield around the chips disposed on the bottom side of the printed circuit board. Also, additional screw or bolt means would be required to electrically couple the second heat sink to the reference plane of the printed circuit board in order to form an EMI shield. The thickness and weight of the total assembly may be inconsistent with the space and weight constraints of a compact notebook computer.

No previously known notebook computer has addressed the problem of combining the function of a lightweight EMI shield and a compact heat sink in a synergetic manner. However, the problems of achieving effective heat dissipation and EMI shielding in a low profile notebook computer design will become progressively worse as CPU clock rates increase. Also, while notebook computers are one example of an electronic device requiring a compact assembly, other electronic devices, such as high performance palmtop computers, face many of the same thermal dissipation and EMI problems.

What is desired is a low-profile assembly for enclosing electronic circuits in an EMI shield while also providing an efficient heat dissipation function.

SUMMARY OF THE INVENTION

The present invention is directed to a structure which combines the functions of an electromagnetic interference (EMI) shield enclosure and heat sink. The present invention generally comprises a heat spreading plate comprised of an electrically conductive material and a receptacle formed from an EMI shield material, wherein the receptacle has a grounding tab electrically coupled to the tray so that the receptacle is electrically coupled to the heat spreading plate by bringing the grounding tab of the receptacle into mechanical contact with the heat spreading plate.

One aspect of the present invention is the use of a bilayer EMI material comprised of an insulating interior layer and a conductive outer layer to form the receptacle. A portion of the EMI material may be formed into a grounding tab with an exposed portion of the conductive outer layer of the EMI material for making electrical contact to the heat spreading plate.

Another aspect of the present invention is the use of spacer layers to achieve a predetermined separation between thermally conductive blocks disposed on the heat spreading plate and chips mounted on a motherboard that is enclosed by the EMI shield. Appropriate selection of the separation distance of the spacer elements permits thermally coupling between the thermally conductive block and the chip while also facilitating a pressure contact between the grounding tabs and the heat spreading plate.

Still another aspect of the present invention is a notebook computer assembly in which the heat spreading plate is used to provide a support or stiffening function for other components of the notebook computer. In one embodiment, a portion of the heat spreading plate is utilized to provide mechanical support for a keyboard.

In still yet another aspect of the present invention, an auxiliary heat sink is incorporated in the liquid crystal display section of the notebook computer and thermally coupled to the thermally conductive blocks. The auxiliary heat sink reduces the heat dissipation requirements of the heat spreading plate, facilitating a compact, low profile notebook computer design consistent with a large thermal load.

BRIEF DESCRIPTION OF THE DRAWINGS

FIG. 1 is a perspective view of a notebook computer showing a computer base section and LCD display section.

FIG. 2 is an exploded perspective view of an electromagnetic interference shield, motherboard, and heat sink of an embodiment of the present invention.

FIG. 3 is a side view of the EMI shield tray of FIG. 2 along line 3'—3'.

FIG. 4A is a side view of an embodiment of an assembled EMI shield and heat sink of FIG. 2 along the line 3'—3' but with additional conductive spacer elements.

FIG. 4B is a side view of an embodiment of the present invention similar to FIG. 4A, except with insulating spacer elements instead of conductive spacer elements.

FIG. 5 is a partial perspective view of an embodiment of the present invention in which heat is coupled to an auxiliary heatsink disposed behind the LCD bezel.

FIG. 6 is a side view of an embodiment of the present invention in which the heat spreading plate in the computer base section performs an additional support function.

DETAILED DESCRIPTION OF THE INVENTION

The present invention is described in detail in the context of solving problems encountered in notebook computer design. However, the inventors of the present invention believe that other compact electronic devices, such as palmtop computers, may benefit from the inventive combined electromagnetic interference (EMI) shield and heat sink design. Also, since it is desirable to reduce the size and number of components in an electronic device to facilitate manufacturing, the inventive combined EMI shield and heat sink design may also be useful for a wide variety of consumer and aerospace devices.

The inventors of the present application have recognized that a significant benefit would be achieved if the EMI shield and heat sink were designed in a synergetic manner with respect to the requirements of notebook computers. The general space constraints imposed in designing a high performance notebook computer may be illustrated with reference to FIG. 1. FIG. 1 is a perspective drawing showing a compact notebook computer 10, although many individual details vary from computer-to-computer. The notebook computer 10 has a liquid crystal display (LCD) screen 20 disposed on an LCD bezel frame 30 coupled by hinges 40 to a computer base portion 50. Typically, the base region 50 has a vertical height 57 less than about four centimeters thick and preferably less than about two centimeters in thickness. As shown in FIG. 1, the LCD bezel frame comprises a substantially rectangular frame for holding a LCD screen 20. The computer base 50 contains a conventional computer keyboard section 60 (not shown in detail) for typing in information. The computer base 50 comprises an outer frame, or housing, 51 which contains the computer electronics. The computer base 50 may also have a pointing device 70 which emulates part of the function of a conventional mouse. The notebook computer 10 may also have modules 80 and 90 which slide into the base portion 50. These modules may comprise a battery unit or other electronic functions, such as a hard disk drive unit. However the function of modules 80, 90 could also be achieved by including the function of modules 80, 90 inside the base 50.

FIG. 2 shows an exploded perspective view of an embodiment of the present invention in which the motherboard of a notebook computer 10 disposed in computer base section region 50 is enclosed in a combination electromagnetic interference (EMI) and heat spreading plate enclosure. A heat spreading plate 200 preferably has a substantially planar surface with a thickness 202 that is significantly less than the five-to-ten millimeters of common finned (extrusion) heat sinks. Generally, it is desirable to make heat spreading plate 200 as thin as possible consistent with heat spreading plate 200 performing a heat dissipation function. As is well known by those of ordinary skill in the art of mechanical engineering, the thermal conductance of heat across a plate-shaped member decreases as the thickness of the plate decreases. Thus, the ability of a heat spreading plate to conduct heat away from a heat source, such as a notebook computer CPU, becomes less effective as the plate thickness decreases. However, the inventors have realized that a heat spreading plate may effectively dissipate heat from a notebook computer CPU even though the plate is comparatively thin (e.g., less than about two millimeters). A substantial benefit is achieved in terms of vertical clearance if the heat spreading plate 200 is less than about two millimeters in thickness 202. Preferably, the heat spreading plate 200 has a thickness 202 that is less than about one millimeter in thickness in order to reduce weight and conserve space. The heat spreading plate 200 is preferably composed of a high thermal conductivity material, such as copper. However, aluminum, while not having as high a thermal conductivity as copper, is lightweight and lower in cost and is thus a preferred material for the heat spreading plate 200.

The main printed circuit board assembly 210, also known as a "motherboard," has high thermal dissipation components 215 disposed upon its surface. These high thermal dissipation electronic components 215 may comprise the central processing unit (CPU) of the notebook computer. Electronic components 215 may thus comprise one or more chips. However, since the teachings of the present invention are applicable to other electronic devices generating heat and electromagnetic interference, the present invention is also applicable to a more arbitrary circuit assembly that contains circuit elements that generate heat and electromagnetic interference. These may include, but are not limited to, radio-frequency and microwave circuits and high frequency digital circuits.

The electronic components 215 are preferably thermally coupled to heat spreading plate 200 by thermally conductive blocks 205. The thermally conductive blocks 205 serve to couple heat from electronic components 215 to heat spreading plate 200. However, conductive blocks 205 may also including cushioning elements to facilitate providing a strong thermal coupling between electronic components 215 and heat spreading plate 200 without overstressing electronic components 215. The thermally conductive blocks 205 preferably have at least the same surface area as the electronic component 215 from which they conduct heat (e.g., a 2 centimeter×2 centimeter chip should have a block with a similar, or somewhat larger, surface area). The thickness of the conductive block 205 is preferably comparatively thin in order to save space and weight. A variety of thermally conductive block materials are well known in the art of computer fabrication. Some of these include thermally conductive elastometer materials to permit a thermally conductive block to be brought into physical contact with the surface of a chip. This permits a strong thermal coupling of heat from a chip 215 through conductive block 205 into a heat spreading plate 200 attached to the opposed side of the conductive block 205.

As indicated in FIG. 2, the motherboard 210 fits into an EMI shield receptacle 220. The EMI shield receptacle 220 is preferably a generally tray-shaped receptacle dimensioned so that the motherboard assembly 210 fits inside of the receptacle 220 in a substantially conformal manner. The EMI receptacle 220 is preferably a tray-like structure having a bottom panel 230 and four side-wall panels 235. This facilitates mating the receptacle 220 to common printed circuit board assembly 210 designs. However, the present invention may be used with other thermal dissipation elements besides a printed circuit board assembly 210 with a substantially rectangular cross-section. For example, receptacle 220 could have a cylindrical shape if it was dimensioned to mate with a cylindrical-shaped assembly. As shown in FIG. 2, the side walls 235 have substantially the same height so that receptacle 220 may be covered by a heat spreading plate 200 to form a six-sided EMI shield enclosure. However, the receptacle 220 may also have side walls 235 of variable height designed to mate with a non-planar cover to form an EMI shield enclosure. Thus, while FIG. 2 shows an embodiment particularly well suited to form an EMI shield enclosure around a printed circuit board assembly, the teachings of the present invention may be adapted to form an EMI shield enclosure around an electronic assembly with a more arbitrary shape.

The EMI shield receptacle 220 is preferably made from a flexible material comprised of an electrically insulating inner layer and an electrically conductive outer (shield) layer. FIG. 3 is a cross-sectional schematic diagram of the shield receptacle 220 of FIG. 2 along the line 3'—3' of FIG. 2. As shown in FIG. 3, the bottom panel 230 and side wall panels 235 are preferably made from a material having at least two distinct material layers 240, 245. An insulated inner layer 240 permits the motherboard 210 to be snugly placed in the EMI receptacle 220 with a low risk of shorting components on the motherboard assembly 210 to conductive portions on the EMI shield. The insulated inner layer 240 thus eliminates the need for separate electrical isolation means, such as insulating spacers, to physically separate the EMI shield receptacle 220 from conductive components of the motherboard assembly 210.

As shown in FIG. 3, the bottom panel 230 and side wall panels 235 comprise at least one conductive layer 245. This conductive layer 245 may be a metal film or other conductive layer, such as a layer of metal fibers or metal flakes contained in another materials structure. Additional layers (not shown) could be added to a portion of the surface of conductive layer 245 to insulate the outer surface of panels 230, 235. Some EMI shield materials, for example, consist of a metal film or metal fibers embedded between two insulating layers. However, the bilayer material of FIG. 3 is preferable because it facilitates the fabrication of an integral grounding tab 225 attached to receptacle 220 to provide an electrical connection between receptacle 220 and heat spreading plate 200. A more complex layer structure, such as a conductive layer 245 embedded between two insulating layers could be used but would required an additional step to either strip a portion of the insulation from the conductive layer 245 and/or the attachment of separate grounding tabs to a portion of conductive layer 245.

Although there are numerous ways that an EMI shield receptacle 220 could be fabricated, there are commercially available EMI shield materials that are comprised of an insulating layer 240 and conductive layer 245. A variety of EMI shield materials are commonly used in the aerospace electronics industry to form a substantially six-sided EMI shield enclosure around sensitive electronic components, such as radio/navigation electronics. Such shield materials often are comprised of a thin foil or layer of metal fibers attached to, or embedded in, an insulating material. Such shield materials are typically slightly flexible so that they may be molded onto the housings of electronic devices with conventional thermal and pressure forming techniques. One such material is FORMSHIELD™, produced by Spraylat, Inc., located in Mount Vernon, N.Y. FORMSHIELD™, may be vacuum or pressure formed into a variety of shield shapes. Materials such as FORMSHIELD™ are lightweight and also may utilize comparatively thin layers, such as insulating layers less than about one millimeter in thickness and a foil-like metal layer less than about several hundred microns in thickness. Commercially available shield materials, such as FORMSHIELD™, are available in sheet thicknesses between about 0.1-to-1.0 millimeters.

In the present invention, a bilayer material similar to that of FORMSHIELD™ is preferably vacuum or pressure formed into a tray-shaped receptacle similar to that shown in FIG. 2. There are also preferably one or more grounding tabs 225 disposed on the top edges of side-wall panels 235 of receptacle 220 to form electrical connections to a cover element. The grounding tabs 225 reveal a significant area (e.g., several square millimeters) of conductive layer 245 that may contact the bottom side of heat spreading plate 200. Since FORMSHIELD™ is a flexible material, the motherboard 210 may be inserted into the EMI receptacle 220 after the enclosure is formed by bending the tabs 225 and placing the motherboard 210 in receptacle 220. Alternately, the tabs 225 may be folded into place after the motherboard is inserted into shield receptacle 220. The tabs 225 have a substantial surface area such that pressing heat spreading plate 200 onto tabs 225 creates a large area for an electrical interconnection between conductive layer 245 and the bottom side 204 of heat spreading plate 220 to form a six-sided EMI enclosure around motherboard assembly 210.

Grounding tabs 225 are preferably electrically connected to heat spreading plate 200 by a low pressure mechanical contact between tabs 225 and heat spreading plate 200. EMI materials similar to FORMSHIELD™ are inconsistent with many common electrical interconnection process. For example, a lightweight polymer or plastic insulating layer would melt or deform at a temperature hot enough to solder connections between the conductive layer 245 of tabs 225 to heat spreading plate 200. Although conductive epoxies could be used to form an electrical connection between tabs 225 and heat spreading plate 200, there may be substantial thermal stresses associated with the difference in the thermal coefficient of expansion of the EMI receptacle 220 and heat spreading plate 200. In particular, a high performance CPU circuit component 215 may generate considerable heat so that the EMI enclosure experiences temperature swings of greater than sixty degrees Celsius. Consequently, a conductive epoxy bonding process may be unreliable. Additionally, since a motherboard assembly 210 may be serviced during the lifetime of the notebook computer, an epoxy process has the disadvantage that the epoxy bond would have to be broken to access the motherboard, which results in the risk of damaging the EMI shield material every time the notebook computer is serviced.

A pressure contact between tabs 225 and heat spreading plate 200 is thus a preferred electrical interconnection process. The requisite pressure to create sufficient mechanical pressure between tabs 225 and the bottom 204 of heat spreading plate 200 may be accomplished by a variety of means, However, preferably the heat spreading plate 200 is automatically slightly pressed onto tabs 225 when heat spreading plate 200 is mounted into the notebook computer. Another important consideration is that the thermally conductive block 205 is brought into thermal contact with chip 215. An air gap between thermally conductive block 205 and chip 215 would result in poor thermal coupling. However, excessive pressure between conductive block 205 and chip 215 may damage chip 215. Preferably a spacer element is used to achieve a predetermined separation distance between conductive block 205 and chip 215. As shown in FIG. 4A, additional conductive spacers 208 may be used to electrically couple tabs 225 and heat spreading plate 200. The spacers 208 also allow the thermally conductive block 205 to be brought into thermal contact with chip 215. Appropriate selection of spacer 208 with a predetermined height $h_s$ allows the heat spreading plate 200 to be bolted or screwed to a portion of housing 211 with the thermally conductive block 205 brought into thermal contact with chip 215. Appropriate selection of the conductive spacer height relative to the thickness of the EMI shield material further results in establishing and maintaining electrical contact between conductive layer 245 of tabs 225 and heat spreading plate 200.

While the embodiment of FIG. 4A is one solution to the problem of achieving electrical and thermal coupling it has the drawback that excessive stress may be placed on grounding tabs 225. Moreover, since tabs 225 are fixed, they may be placed under significant thermal stresses. As is well known, the thermal coefficient of expansion of a material describes the change in length of a material caused by changes in temperature. However, in an assembly comprised of rigidly attached members with different thermal coefficients of expansion (TCE), thermal stresses may develop as the assembly is thermally cycled. Thus, the embodiment of FIG. 4A may require additional steps, such as thicker metal layers 245 or a substantial matching of the TCE between spacer 208 and the EMI shield material comprising shield enclosure 220, to reduce the risk of thermal stresses damaging portions of the EMI shield during the lifetime of the notebook computer.

A preferred spacer configuration is shown in FIG. 4B. The spacer 209 results in thermal contact between thermally conductive block 205 and chip 215. The height, $h_s$, of spacer 209 is the height, $h_c$, of chip 215 plus the height $h_b$, of thermally conductive block 205 in a thermally conductive state butted against chip 215 (which in the case of an elastomer may be slightly less than its free, uncompressed state). Generally, insulating spacer elements 209 disposed on an upper surface 217 of the motherboard assembly 210 or on the bottom 204 of heat spreading plate 200, may also be utilized in the assembly to maintain a predetermined separation distance for the purpose of achieving the desired thermal and electrical interconnections. In the embodiment of FIG. 4B, the grounding tabs 225 contact the bottom 204 of heat spreading plate 200 because of an internal spring force, $F_s$, associated with the resiliency of the materials comprising the EMI shield receptacle 220. Experiments by the inventors indicate that FORMSHIELD™ has a desirable resiliency. The plate heat spreading 200 is pressed against tabs 225, which puts the side-walls 235 and/or tabs 225 into slight compression, which generates restorative spring-like forces in the EMI shield material. The resulting restorative forces keep the tabs 225 in mechanical contact with the bottom 204 heat spreading of plate 200. This spring-like contact mechanism permits some transverse motion of tabs 225 on the surface 204 of heat spreading plate 200 while maintaining an electrical connection between tabs 225 and heat spreading plate 200. Thus, the inventors believe that the embodiment of FIG. 4B facilitates a low-stress electrical connection between tabs 225 and heat spreading plate 200. In particular, since the tabs 225 are capable of some transverse movement, thermal stresses may be reduced compared to the case of rigidly attaching the tabs 225 to plate 200. Although FORMSHIELD™ is the only commercially available material known by the inventors to have the desired resiliency, those of ordinary skill in the art of materials science are familiar with methods to alter the materials properties of plastics, polymers, and other common insulators to achieve a resilient materials structure. Thus, the inventors believe that other EMI material structures may be modified and utilized in the embodiment of FIG. 4B.

The present invention may be further modified to achieve additional benefits. A heat spreading dissipation plate 200 may be sufficient to provide adequate thermal dissipation for many CPU applications. However, in one embodiment of the present invention, an auxiliary heat sink is used in combination with the heat spreading plate 200. As shown in FIG. 5, in addition to heat spreading plate 200 an auxiliary heat sink 255 is thermally coupled to either the thermally conductive block 205 or a region of heat spreading plate 200 proximate to block 205. The auxiliary heat sink 255 is used to improve the heat dissipation function while maintaining a low profile assembly with a height less than about four centimeters in height. The auxiliary heat sink 255 is preferably disposed in a portion of the LCD bezel 260 and is coupled to the heat spreading plate 200 or thermally conductive block 205 by a thermally conductive member 250. The thermally conductive member 250 is preferably a compact element that has a high effective thermal conductivity, such as a heat pipe. Heat pipes are a well-known class of vapor-liquid phase-change devices that transfer heat from a hot reservoir to a cold reservoir using capillary forces generated by a wick, or porous material, and a working fluid disposed in a generally pipe-shaped structure. The LCD bezel 260 is a preferred location for an auxiliary heat sink because a comparatively large surface area heat sink 255 may be placed in the LCD bezel 260. Also, since the LCD bezel 260 of a modern notebook computer is comparatively thin, there is substantial coupling of heat to the atmosphere from an auxiliary heat sink mounted in the LCD bezel. The auxiliary heat sink 255 may, however, be located inside the computer base section proximate to one of the outer surfaces of the housing of the computer base section to facilitate coupling of heat to the atmosphere.

An auxiliary heat sink provides two main advantages. First, it is desirable to increase the heat dissipation capacity with an auxiliary heat sink 255 so that the electronic circuits disposed in the EMI shield 220 remain at a suitable operating temperature. Generally, the reliability of electronic components improves if the maximum operating temperature is kept low. Second, it is desirable to maintain the computer keyboard at a comfortable operating temperature. An auxiliary heat sink 255 dissipates part of the thermal load that would otherwise flow through the heat spreading plate 200 underneath the keyboard. Consequently, an auxiliary heat sink may assist in maintaining the keyboard at a comfortable typing temperature. This may be an important consideration for high thermal dissipation applications, such as a high performance CPU operating at a rapid clock rate.

The inventive combination EMI shield and heat sink provides a significant reduction in size compared to utilizing a separate heat sink and EMI shield. However, another benefit of the inventive combination EMI shield and heat spreading plate is that it may be designed as part of a larger notebook computer that facilitates the manufacture of a compact, low profile notebook computer. As previously discussed, the heat spreading plate 200 may be bolted into place to form the combined EMI shield and heat sink. However, the inventors have recognized that heat spreading plate 200 may be extended and used as a support structure for other elements in a notebook computer.

FIG. 6 shows an embodiment of the invention in which the heat spreading plate 300 also performs a support function for a computer keyboard 350. The plastic housing of a notebook computer is comparatively thin. Consequently, the plastic housing may not provide the desired stiffness to support a computer keyboard 350. This is particularly true for those users who exert a considerable typing force upon keyboard 350. It is thus desirable to utilize a metallic stiffening element to improve the typing response and the durability of the keyboard 350 of notebook computer 10. The inventors of the present invention have recognized that the heat spreading plate of the present invention may be adapted to perform an additional stiffening/support function for other notebook computer components, such as the keyboard 350. As shown in the embodiment of FIG. 6, a computer keyboard 350 fits into ledges 355 of the upper case 335 of the notebook computer 10. A keyboard support region 340 disposed on heat spreading plate 300 support the ledges 355 holding keyboard 350. The keyboard support region 340 is preferably an embossed portion of heat spreading plate 300. The ledges 355 are preferably comprised of a low thermal conductivity plastic and preferably raise the keyboard 350 slightly above the keyboard support region 340 so that the thermal conductance from heat spreading plate 300 to keyboard 350 is low.

Preferably, the combined EMI shield, heat spreading plate, and support structure is designed to be mounted using low-cost mounting techniques. As shown in FIG. 6, the motherboard assembly 320 preferably has bolt or screw holes 325. The five sided EMI receptacle 330 preferably has corresponding bolt or screw holes 327 stamped or punched in its bottom, although common flexible EMI shield materials are thin enough that a bolt or screw may readily penetrate through the shield layers. Also, the EMI receptacle 330 may be molded to substantially conform around the contours of holes 327. During assembly, the motherboard 320 is first placed in the EMI receptacle 330. Screws or bolts 360 may be used to attach the upper portion of the housing 335, the heat spreading plate 300, the motherboard assembly 320, the EMI receptacle 330, and the lower portion of the housing 365. The tabs 225 (not shown in FIG. 6) of the EMI receptacle 330 are pressed into contact with plate 300 during the assembly process by the pressure imposed by the screws 360. Spacer elements 315 define a predetermined distance to which the motherboard 320 may be brought towards the thermally conducting block 305. Spacer elements 315 are preferably selected so that excessive pressure is not applied to chip 310. The height of spacer 315 is also preferably selected to provide adequate pressure in the assembled notebook computer to push the tabs 225 into electrical contact with heat spreading plate 300 and to bring thermally conductive block 305 into thermal contact with chip 310.

There are some tradeoffs involved in the choice of EMI shield material and tab design related to the fact that the conductive layer 245 is comparatively thin. It is desirable in the formation of receptacle 320 that the tabs 225 not be overly stressed during the fabrication and assembly process. Depending upon the particular shield material used, there is the possibility of damage to the conductive layer 245 in the EMI shield. For example, cracks and/or tears in the conductive coating may occur which would comprise the electrical integrity of conductive layer 245. For example, the FORM-SHIELD™ coating has a comparatively thin conductive coating. There is a slight possibility of the conductive coating tearing along a sharp crease used to form a grounding tab 225 during assembly, subsequent thermal cycles, or during subsequent maintenance/repair of the motherboard. Consequently, it may be desirable to use more than one grounding tab 225 to reduce the slight risk that a single tab will not provide a proper electrical connection between the heat spreading plate 200 and the panels 230, 235 of the EMI receptacle 220. Also, the vacuum or pressure process used to fabricate receptacle 220 and grounding tabs 225 is preferably selected to provide slightly rounded bends and corners rather than sharp creases.

Compared to the conventional approach of a separate EMI shield and heat sink, the inventive combined EMI shield and heat sink significantly reduces the total size and weight required to achieve the EMI shield and heat sink functions. Furthermore, the present invention may also comprise an EMI shielding function, heat sink function, and mechanical support function to further reduce the total number of components required to achieve these functions.

The inventive EMI shield and heat sink is particularly useful for notebook computers. The inventors have successfully fabricated EMI shield and heat sink structures designed to fit into a computer base section 50 of a notebook computer with a vertical height of less than about four centimeters. However, the present invention may be used in electronic devices with even less vertical clearance. The heat spreading plate 200 is preferably less than about a millimeter thick. EMI shield materials, such as FORMSHIELD™, are available in thicknesses between about 0.1-to-1.0 millimeters in thickness. Thus, the combined height of the heat spreading plate 200 and the thickness of the materials comprising the bottom panel 230 and grounding tabs 225 is at most a few millimeters. Consequently, the inventors believe that the present invention may be beneficially used in a variety of electronics applications where the vertical clearance is substantially less than four centimeters, such as ultra-compact notebook and palmtop computers with a vertical clearance of between two-to-three centimeters.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. An electromagnetic interference (EMI) shield, comprising:

a heat spreading plate comprised of an electrically conductive material having a substantially planar surface region; and a receptacle formed from a multi-layer EMI shield material, said receptacle having an interior surface comprising an insulating layer and an exterior surface composed of an electrically conducting layer;

wherein said receptacle has one or more grounding tabs electrically coupled to said conducting layer of said receptacle so that said receptacle is electrically coupled to said heat spreading plate by bringing said one or more grounding tabs of said receptacle into mechanical contact with the surface of said heat spreading plate;

wherein said one or more grounding tabs comprise folded portions of said EMI shield material of said receptacle;

wherein said EMI shield material is resilient so that said one or more grounding tabs are electrically coupled to said heat spreading plate by restorative forces in said EMI shield material.

2. The EMI shield of claim 1, wherein said one or more grounding tabs are free to move transversely with respect to the surface of said heat spreading plate.

3. A low profile heat dissipation and electromagnetic interference shield assembly, comprising:

a heat spreading plate, said heat spreading plate comprising a substantially planar material less than about two millimeters in thickness;

a thermally conductive block disposed on the surface of said heat spreading plate;

a circuit assembly comprising at least one circuit element which generates heat and electromagnetic interference (EMI);

a receptacle comprised of a resilient EMI shield material having a thickness less than about one millimeter, said receptacle dimensioned to house said circuit assembly, said receptacle having one or more grounding tabs; wherein said one or more grounding tabs are formed from a section of said EMI shield material; and a spacer element, said spacer element disposed between said heat spreading plate and said circuit assembly; said spacer element dimensioned to separate the surface of said heat spreading plate and said circuit assembly by a predetermined distance sufficient to thermally couple said thermally conductive block and said circuit assembly;

wherein said receptacle is electrically coupled by said one or more grounding tabs to said heat spreading plate to form an EMI shield enclosure around said circuit assembly.

4. The assembly of claim 3, wherein said one or more grounding tabs are electrically coupled to said heat spreading plate in response to restorative forces in said resilient EMI shield material when said receptacle is brought into contact with said heat spreading plate.

5. A low profile heat dissipation and electromagnetic interference shield notebook computer assembly for a notebook computer having a computer base section and a display section, comprising:

a motherboard disposed in said computer base section, said motherboard comprising a printed circuit board assembly;

a heat generating circuit element mounted on the surface of said motherboard;

a heat spreading plate;

a thermally conductive block, said block disposed on the surface of said heat spreading plate;

a spacer element, said spacer element disposed between the surface of said motherboard and said heat spreading plate; said spacer element dimensioned to separate the surface of said heat spreading plate and the surface of said motherboard by a predetermined distance sufficient to thermally couple said thermally conductive block and said high heat dissipation circuit; and a receptacle comprised of an electromagnetic interference (EMI) shield material, said receptacle dimensioned to house said motherboard and having only one open end, said receptacle having one or more grounding tabs coupled to the shield material of said receptacle proximate to said open end of said receptacle;

wherein said receptacle is shaped to mate with said heat spreading plate with said one or more grounding tabs electrically coupling said receptacle to said heat spreading plate so as to form an EMI shield enclosure around said motherboard;

wherein said receptacle further comprises four side wall panels attached to a bottom panel, the panels of said receptacle comprised of an exterior continuous electrically conductive layer and an interior electrically insulating interior layer;

wherein said side wall panels of said receptacle are folded to form at least one of said one or more grounding tabs so that a portion of said electrically conductive layer of said at least one of said one or more grounding tabs of said receptacle is electrically coupled to said heat spreading plate by bringing said at least one of said one or more grounding tabs of said receptacle into mechanical contact with said heat spreading plate.

6. The notebook computer assembly of claim 5, wherein said panels of said receptacle comprise resilient panels consisting of a continuous electrically conductive exterior layer and an electrically insulating interior layer.

7. The notebook computer assembly of claim 6, wherein said receptacle is sufficiently compressed so that at least one of said one or more grounding tabs remains in electrical contact with said heat spreading plate over a temperature swing of at least sixty degrees Celsius.

* * * * *